(12) United States Patent
Zhou et al.

(10) Patent No.: US 7,841,740 B2
(45) Date of Patent: Nov. 30, 2010

(54) LED ASSEMBLY FOR LED LAMP CONSISTING OF MULTIPLE LED UNITS EACH HAVING A HEAT SINK

(75) Inventors: Zhi-Yong Zhou, Shenzhen (CN); Qiao-Li Ding, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 221 days.

(21) Appl. No.: 12/202,394

(22) Filed: Sep. 1, 2008

(65) Prior Publication Data
US 2009/0244894 A1    Oct. 1, 2009

(30) Foreign Application Priority Data
Mar. 26, 2008    (CN) .......................... 2008 1 0066341

(51) Int. Cl.
*F21V 21/00*    (2006.01)
(52) U.S. Cl. ............................. 362/249.02; 362/249.01
(58) Field of Classification Search ............ 362/249.01, 362/249.02, 249.03, 249.04
See application file for complete search history.

(56) References Cited

U.S. PATENT DOCUMENTS

| | | | |
|---|---|---|---|
| 2006/0012286 A1* | 1/2006 | Cull et al. | 313/500 |
| 2006/0087843 A1* | 4/2006 | Setomoto et al. | 362/249 |
| 2008/0157100 A1* | 7/2008 | Tan et al. | 257/88 |
| 2009/0002988 A1* | 1/2009 | Kim et al. | 362/247 |
| 2010/0053966 A1* | 3/2010 | Tu et al. | 362/249.02 |
| 2010/0118534 A1* | 5/2010 | Lo | 362/249.02 |

FOREIGN PATENT DOCUMENTS

CN    2890599 Y    4/2007
CN    201032082 Y    3/2008

* cited by examiner

*Primary Examiner*—David V Bruce
(74) *Attorney, Agent, or Firm*—Frank R. Niranjan

(57) ABSTRACT

An LED assembly for an LED lamp includes a replaceable bracket and a plurality of LED units mounted on the bracket. The bracket includes a frame and a plurality of mutually crossed beams interconnected in the frame to define a plurality of square openings. Each LED unit includes a printed circuit board, a heat sink secured below the printed circuit board and fixed on the bracket, and a plurality of LEDs mounted on the printed circuit board to be exposed in the openings in the bracket. The bracket can have different configuration so that light beams generated by the LEDs are parallel to each other, in a convergent manner or in a divergent manner.

14 Claims, 9 Drawing Sheets

US 7,841,740 B2

LED ASSEMBLY FOR LED LAMP CONSISTING OF MULTIPLE LED UNITS EACH HAVING A HEAT SINK

BACKGROUND OF THE INVENTION

1. Field of the Invention

The present invention relates to an LED lamp, and more particularly to an LED lamp comprising a replaceable bracket and a plurality of LED units mounted to the bracket. Each LED unit has its own heat sink.

2. Description of Related Art

LEDs have been available since the early 1960's. Because of the relatively high light-emitting efficiency of LEDs, nowadays LED usage has been increased in popularity in a variety of applications, e.g., residential, traffic, commercial, industrial settings. Conventionally, an LED lamp comprises a housing and a plurality of LED modules mounted in the housing. The housing severs as a support for fixing the LED modules thereto, as well as a heat sink for dissipating heat generated by the LED modules to an ambient atmosphere. The LED modules are arranged in the housing in predetermined pattern, thus providing desired light output from the housing.

Since the housing for the LED lamp also functions as a heat sink, the housing needs to be specifically configured in accordance with the heat intensity, density and distribution of the LEDs of the LED lamp whereby the housing can effectively dissipate heat generated by the LEDs of the LED lamp. For a different LED lamp, the housing needs to be re-designed and accordingly needs to have a new mold for manufacturing thereof, whereby the LED lamp has a high cost.

What is needed, therefore, is an LED lamp which can overcome the above-mentioned disadvantages.

SUMMARY OF THE INVENTION

An LED assembly for an LED lamp includes a replaceable bracket for being secured in a lamp housing of the LED lamp, and a plurality of LED units mounted to the bracket whereby the LED units are interlocked together. The bracket includes a frame and a plurality of mutually crossed beams interconnected in the frame to define a plurality of square openings. Each LED unit includes a printed circuit board, a heat sink secured below the printed circuit board and fixed on the bracket, and a plurality of LEDs mounted on the printed circuit board to be exposed in a corresponding opening of the bracket. For different applications of the LED lamp, the lamp housing can be mounted with the bracket of LED assembly having a specifically required configuration. The LED units on the bracket can accordingly have a required orientation, thereby to increase the versatility of the LED lamp.

Other advantages and novel features of the present invention will become more apparent from the following detailed description when taken in conjunction with the accompanying drawings.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
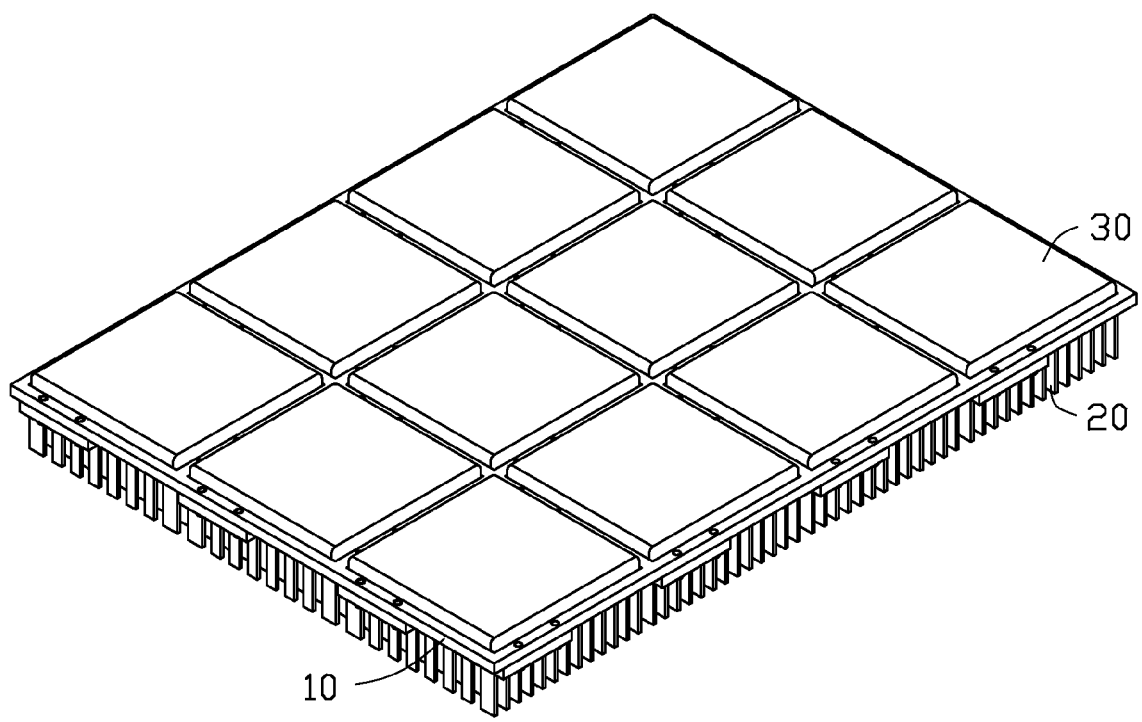
FIG. 1 is an assembled, perspective view of an LED assembly of an LED lamp in accordance with a first embodiment of the present invention.

Referring to FIG. 1, an LED assembly of an LED lamp in accordance with a first embodiment present of the present invention is shown. The LED assembly is used to be mounted in a lamp housing (not shown) of the LED lamp. The LED assembly of the LED lamp comprises a bracket 10 and a plurality of LED units 20 mounted to the bracket 10 whereby the LED units 20 are interlocked together. A cover 30 is attached on the bracket 10 to cover LEDs 24 (FIG. 4) of the LED units 20, thereby protecting the LEDs 24 from contamination.

Figure 2:
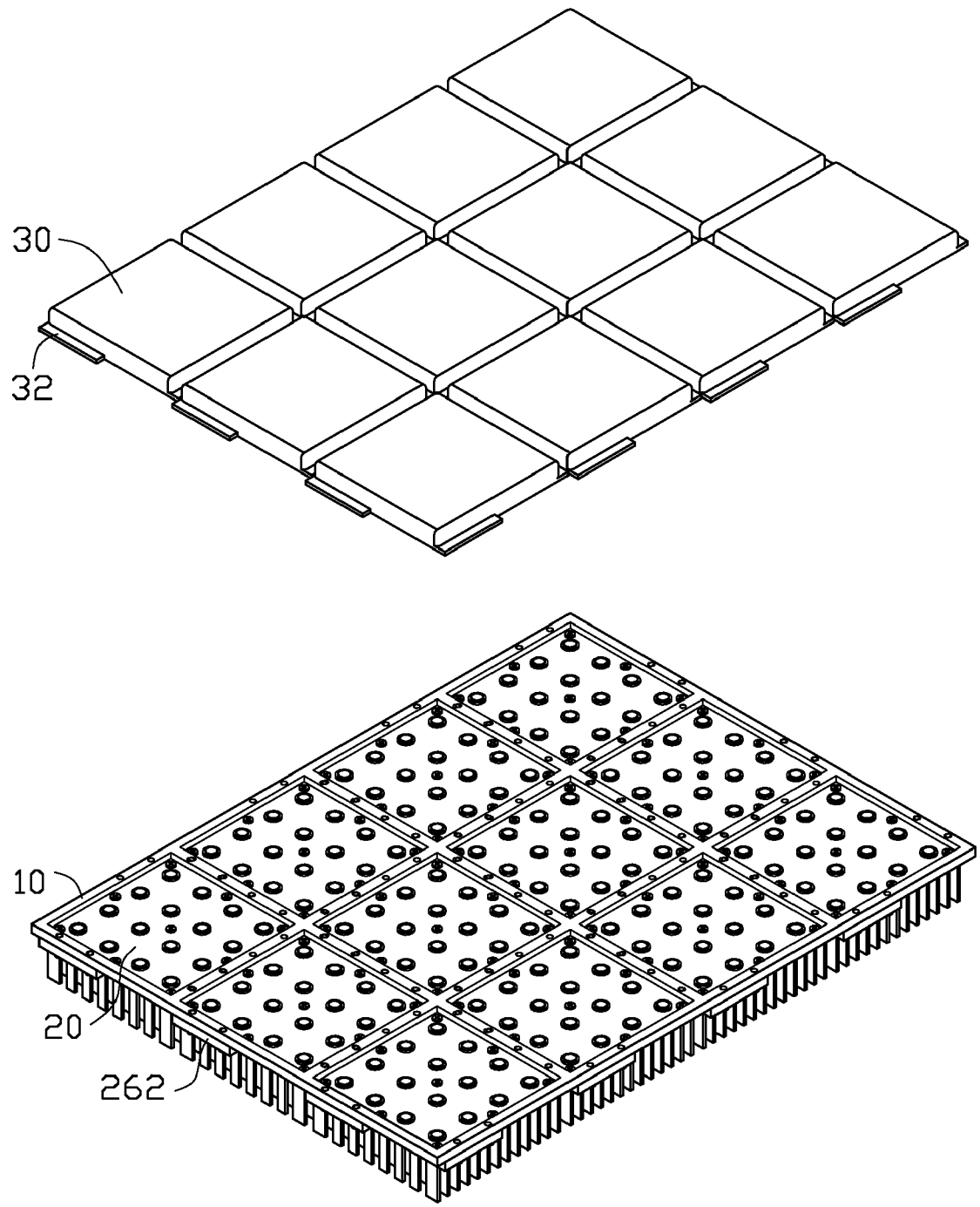
FIG. 2 is an exploded view of FIG. 1.
Figure 3:
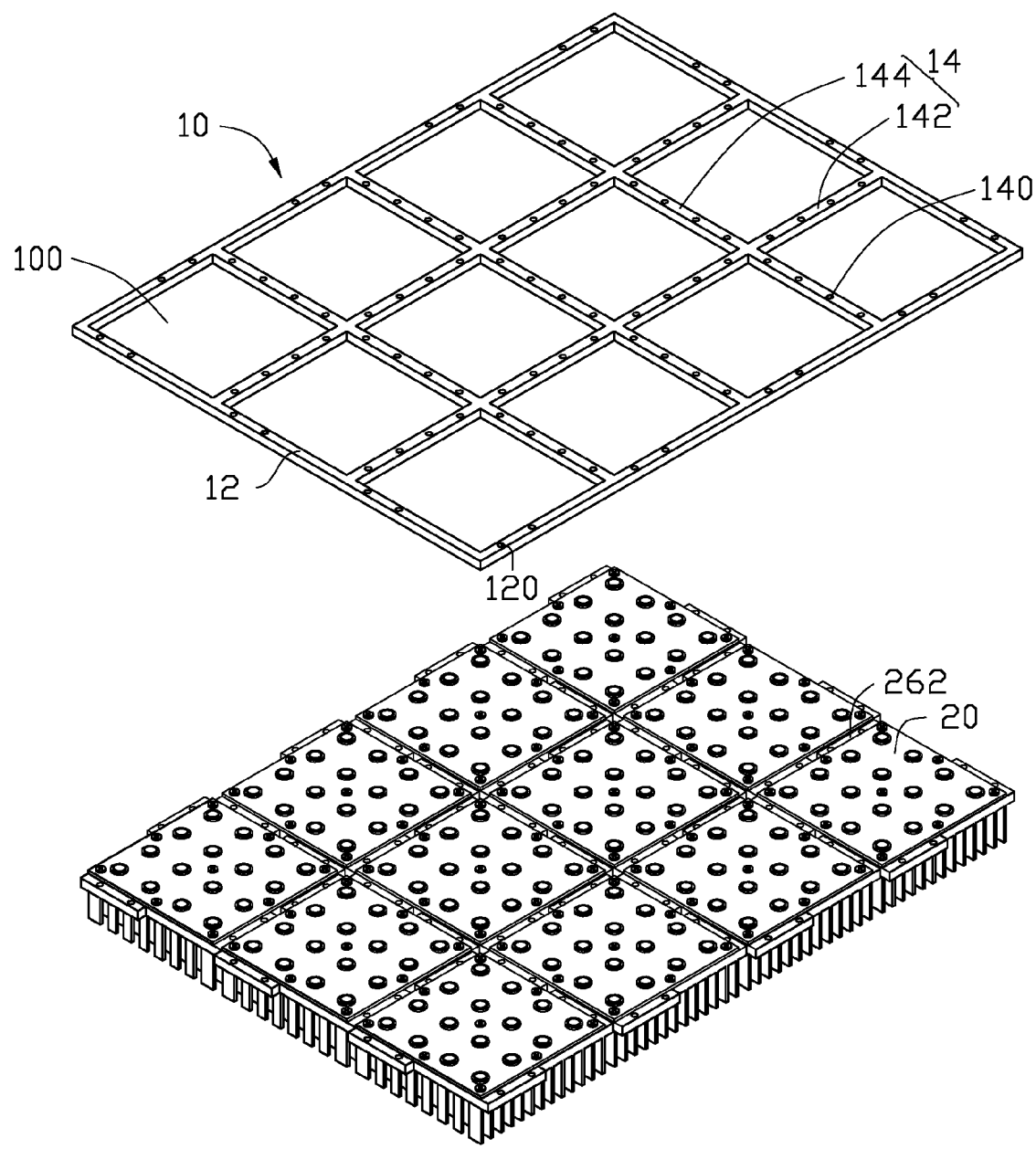
FIG. 3 is an exploded view of a bracket and a plurality of LED units of the LED assembly of FIG. 2.

As illustrated in FIGS. 2-3, the bracket 10 is used for being fixed in the lamp housing to fixedly interconnect the LED units 20 to the lamp housing. The bracket 10 has a substantially planar shape and includes a rectangular frame 12 and a plurality of mutually crossed beams 14 interconnecting four sides of the frame 12. The plurality of beams 14 comprises three transverse beams 142 and two lengthwise beams 144, which connect with each other and divide a rectangular window (not labeled) surrounded by the frame 12 into a plurality of (i.e., twelve) identical square openings 100. A portion of each beam 14 adjacent to a corresponding opening 100 defines four threaded holes 140 therein. A portion of each side of the frame 12 adjacent to a corresponding opening 100 defines two threaded holes 120 therein. The threaded holes 120, 140 are provided for threadedly receiving screws (not shown) thereinto, thereby fixing the plurality of LED units 20 to the bracket 10.

Figure 4:
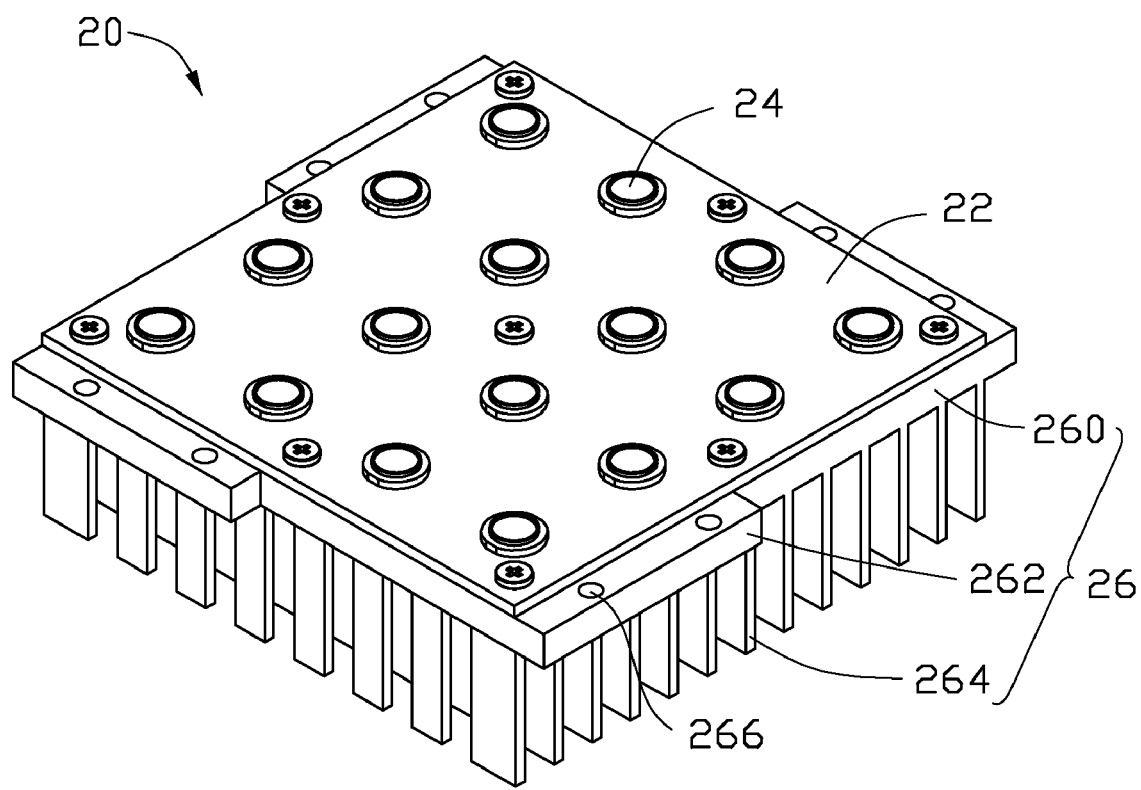
FIG. 4 is an enlarged view of one of the plurality of LED units of FIG. 3.
Figure 5:
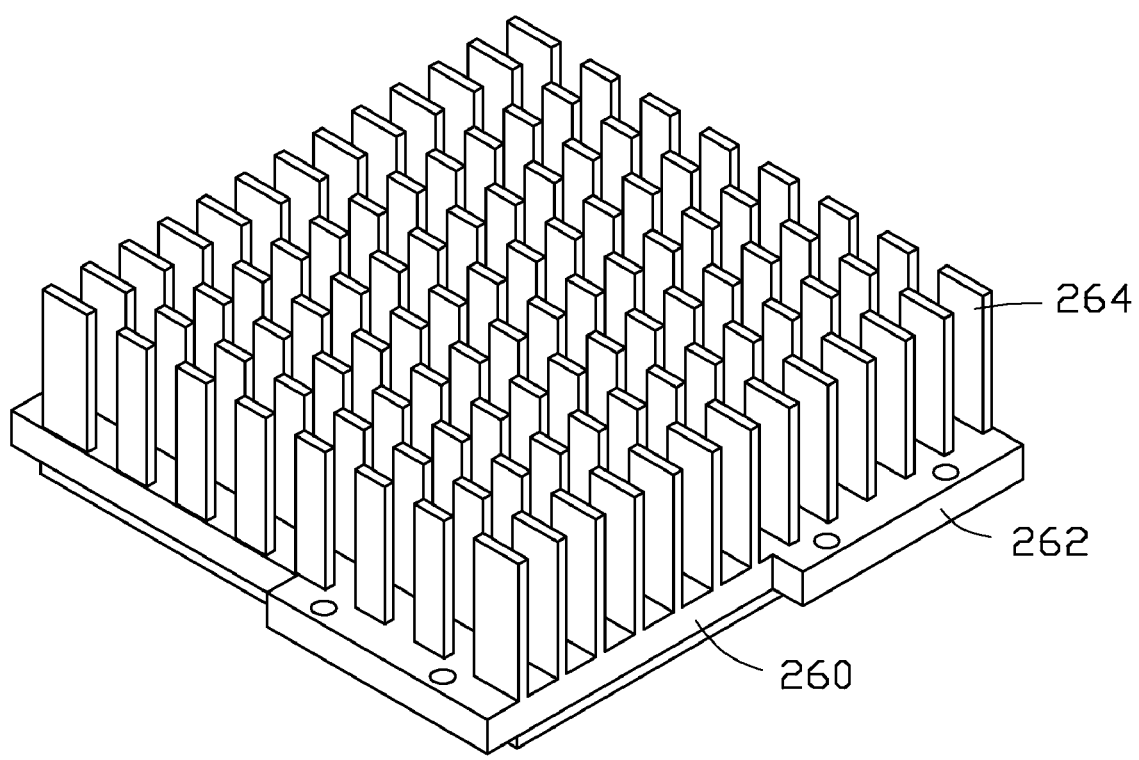
FIG. 5 is an inverted view of FIG. 4.

Referring also to FIGS. 4-5, each LED unit 20 consists of a quadrate printed circuit board 22, multiple LEDs 24 uniformly mounted on a top face of the printed circuit board 22, and a heat sink 26 fixed on a bottom face of the printed circuit board 22 by screws (not labeled). The heat sink 26 comprises a square base 260, four ears 262 respectively protruding outwardly and horizontally from four lateral sides of the base 260, and a plurality of fins 264 extending vertically and downwardly from a bottom side of the base 260. Each ear 262 has a length slightly less than a half of a length of the lateral side of the base 260, wherein an end thereof is flush with a corresponding adjacent lateral side of the base 260, and an opposite end thereof is located close to a middle of the lateral side of the base 260 where the each ear 262 is formed. The length of each ear 262 is designed for conveniently mounting the LED units 20 on the bracket 10 without interference occurring between neighboring LED units 20. When the LED units 20 are mounted to the bracket 10, a gap is defined between confronting ends of the ears 262 of adjacent LED units 20 (see FIG. 3), wherein the ears 262 are in line with each other. Each ear 262 forms two perforations 266 therein, for extending the screws through the LED units 20 to threadedly engage in the threaded holes 120, 140 in the bracket 10, thus fixedly connecting the bracket 10 and the LED units 20 together. The fins 264 are separated from each other by multiple crossed channels (not labeled), for facilitating an airflow through the heat sink 26.

In assembly, the LED units 20 are disposed below the bracket 10 with all of the LEDs 24 thereof exposed in respective openings 100 in the bracket 10, and the ears 262 thereof being in alignment with corresponding portions of the sides of the frame 12 and the beams 14. The screws are brought to extend through the perforations 266 in the ears of the LED units 20 and engage in the threaded holes 120, 140 in the bracket 10, thus realizing a firm joint between the LED units 20 and the bracket 10.

Back to FIG. 2, the cover 30 includes a plurality of square protrusions (not labeled), each of which has a size corresponding to that of an LED unit 20. Each protrusion forms four ears 32 at four sides thereof. A bottom of the protrusion is concaved upwardly to form a square cavity (not shown). The cavity is has a size corresponding to that of the printed circuit board 22 of the LED unit 20, whereby the protrusion can completely cover the LEDs 24 of the LED unit 20.

Figure 6:
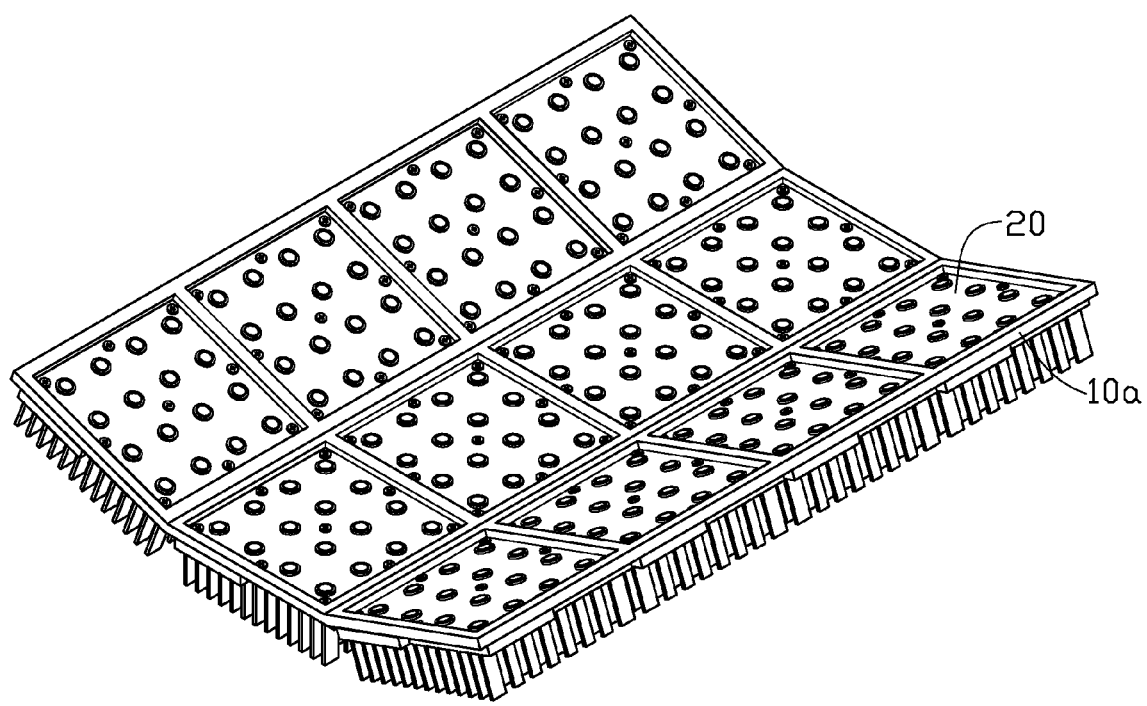
FIG. 6 is an assembled view of an LED assembly of an LED lamp in accordance with a second embodiment of the present invention.
Figure 7:
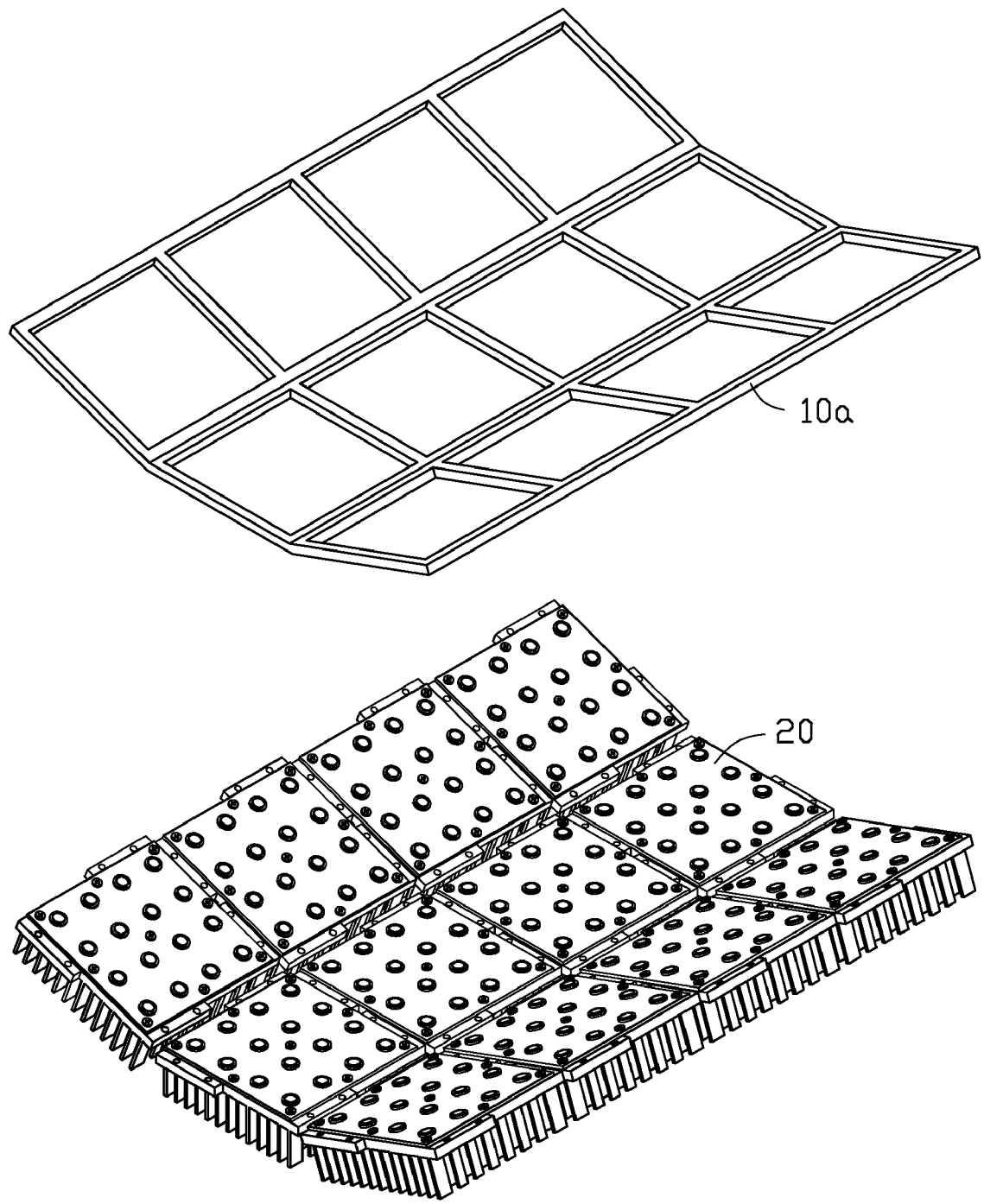
FIG. 7 is an exploded view of FIG. 6.

By attaching the LED units 20 on the bracket 10 which is substantially planar, the LED lamp of the first embodiment can supply uniform illumination with moderate level of luminous flux, since the LEDs 24 radiate parallel light beams all perpendicular to the bracket 10. If the LED lamp is required to be utilized in a situation needs large light intensity, the configuration of the bracket 10 can be varied to that shown in FIGS. 6-7, wherein a middle portion (not labeled) of the bracket 10a remains at its original orientation, while two opposite lateral portions (not labeled) of the bracket 10a are bended to be inclined upwardly. Under a configuration presented by the bracket 10a, the LEDs 24 of the LED units 20 mounted at the three portions of the bracket 10a face in a convergent manner; thus, the light output from the LEDs 24 is focused at a small area just below the middle portion of the bracket 10a, and accordingly, a level of luminous flux supplied by the LED lamp is increased.

Figure 8:
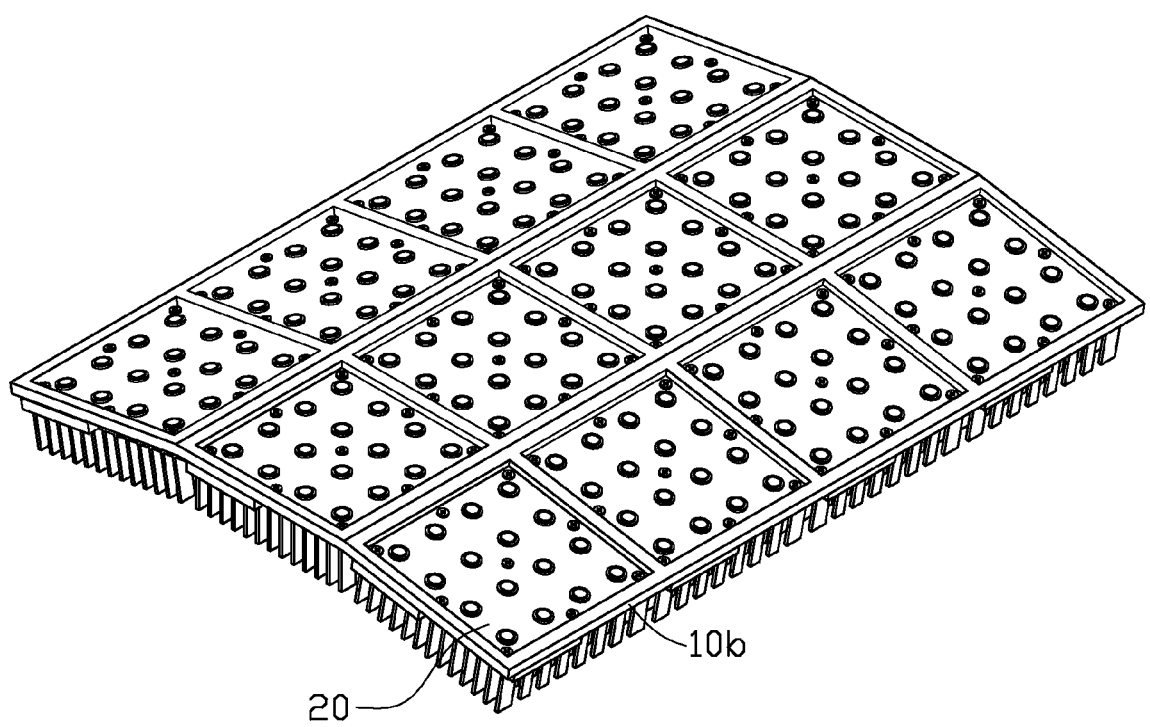
FIG. 8 is an assembled view of an LED assembly of an LED lamp in accordance with a third embodiment of the present invention.
Figure 9:
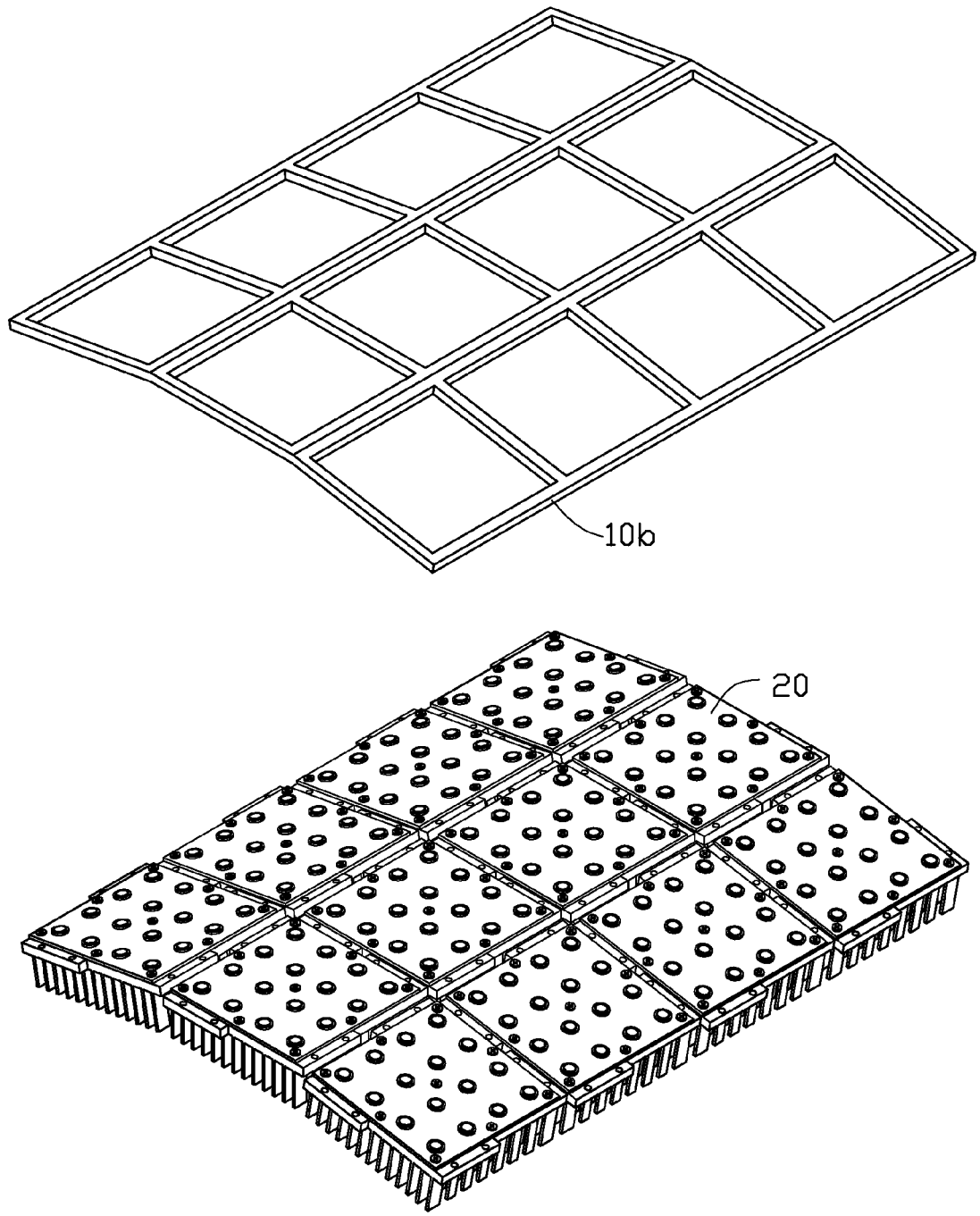
FIG. 9 is an exploded view of FIG. 8.

Alternatively, it can be apprehended that the two lateral portions of the bracket 10 in FIGS. 2-3 can also be bended toward a downward direction, whereby the LEDs 24 of the LED units 20 mounted below the bracket 10a would be oriented in a divergent manner toward three different directions. Such downwardly bended bracket 10b can be seen in FIGS. 8-9, wherein the light outputted from the LED units 20 would be dispersed widely toward respective directions, resulting in a spreading of the light of the LED lamp with reduced intensity. The LED lamp shown in FIGS. 8-9 is suitable for the application needing a large-area illumination and a less light intensity.

Since the LED units 20 are fixed to the lamp housing via the bracket 10, 10a, 10b, which is detachable from the lamp housing, an arrangement of the LED units 20 in the lamp housing can be varied as long as the bracket 10, 10a, 10b being substituted by a differently-shaped one, and accordingly, orientations of the beams outputted from the LED units 20 are adjusted to thereby produce a specially desired illumination. Therefore, by using the bracket 10, 10a, 10b, the LED lamp of the present invention is capable of providing various illumination configurations for meeting different requirements.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An LED assembly for an LED lamp comprising:
a bracket adapted for being mounted in a lamp housing of the LED lamp; and
a plurality of LED units attached on the bracket, wherein each of the plurality of LED units comprises a printed circuit board, a plurality of LEDs mounted on the printed circuit board, and a heat sink fixed on the printed circuit board for dissipating heat from the plurality of LEDs;
wherein the plurality of LEDs and the heat sink of the each of the plurality of LED units are located at two opposite sides of the printed circuit board;
wherein the heat sink of the each of the plurality of LED units comprises a base in thermal contact with the printed circuit board and a plurality of fins extending from the base in a direction remote from the plurality of LEDs; and
wherein the base of the heat sink is in the form of rectangular shape, the base forming four ears at four lateral sides thereof, respectively.

2. The LED assembly as claimed in claim 1, wherein the plurality of LED units is independently mounted on the bracket.

3. The LED assembly as claimed in claim 1, wherein the bracket defines a plurality of openings in which the plurality of LEDs of the plurality of LED units is exposed.

4. The LED assembly as claimed in claim 3, wherein the bracket comprises a frame and a plurality of mutually crossed beams interconnecting the frame, the frame and the plurality of beams cooperatively defining the plurality of openings.

5. The LED assembly as claimed in claim 1, wherein each of the four ears of the each of the plurality of LED units has a length less than half a length of a corresponding lateral side of the heat sink where the each of the four ears is formed.

6. The LED assembly as claimed in claim 1, wherein the bracket is planar, the light radiated from the LED units being parallel to each other.

7. The LED assembly as claimed in claim 1, wherein the bracket has a middle portion and two inclined lateral portions located at two flanks of the middle portion, the light radiated from the LED units being converged.

8. The LED assembly as claimed in claim 1, wherein bracket has a middle portion and two inclined lateral portions located at two flanks of the middle portion, the light radiated from the LED units being diverged.

9. An LED assembly for an LED lamp comprising:
a replaceable bracket adapted for being fixed in a lamp housing of the LED lamp, the bracket defining a plurality of openings; and
a plurality of detachable LED units secured on the bracket to expose LEDs thereof in the openings in the bracket, wherein each of the LED units has a printed circuit board having a first face on which corresponding LEDs are mounted and an opposite second face on which an individual heat sink is mounted to absorb heat generated by the corresponding LEDs;
wherein the individual heat sink has a base engaging with the second face of the printed circuit board and a plurality of fins extending perpendicularly from the base in a direction away from the printed circuit board;

wherein the base of the individual heat sink is in the form of rectangular shape and has four ears at four lateral sides thereof, respectively.

10. The LED assembly as claimed in claim 9, wherein the bracket comprises a middle portion and a pair of lateral portions extending from the middle portion, the plurality of LED units being distributed all over the middle portion and the pair of lateral portions of the bracket.

11. The LED assembly as claimed in claim 10, wherein the pair of lateral portions of the bracket are coplanar with the middle portion.

12. The LED assembly as claimed in claim 10, wherein the pair of lateral portions of the bracket are bended slantwise with respect to the middle portion.

13. The LED assembly as claimed in claim 12, wherein light beams generated by the LEDs are directed in a convergent manner.

14. The LED assembly as claimed in claim 12, wherein light beams generated by the LEDs are directed in a divergent manner.

* * * * *